US011112439B2

(12) United States Patent
Czardybon (10) Patent No.: US 11,112,439 B2
(45) Date of Patent: Sep. 7, 2021

(54) EVALUATING CIRCUIT, SYSTEM, AND METHOD FOR EVALUATING A CAPACITIVE OR INDUCTIVE SENSOR

(71) Applicants: Marius Czardybon, Mannheim (DE); Peter Czardybon, Mannheim (DE)

(72) Inventor: Peter Czardybon, Mannheim (DE)

(73) Assignee: Marius Czardybon, Mannheim (DE)

( * ) Notice: Subject to any disclaimer, the term of this patent is extended or adjusted under 35 U.S.C. 154(b) by 170 days.

(21) Appl. No.: 16/603,562

(22) PCT Filed: Mar. 7, 2018

(86) PCT No.: PCT/DE2018/200022
§ 371 (c)(1),
(2) Date: Oct. 7, 2019

(87) PCT Pub. No.: WO2018/184638
PCT Pub. Date: Oct. 11, 2018

(65) Prior Publication Data
US 2020/0110116 A1    Apr. 9, 2020

(30) Foreign Application Priority Data

Apr. 6, 2017 (DE) ..................... 10 2017 205 908.7

(51) Int. Cl.
*G01R 27/26*    (2006.01)
*G01D 18/00*    (2006.01)
(Continued)

(52) U.S. Cl.
CPC ......... *G01R 27/2605* (2013.01); *G01D 18/00* (2013.01); *G01R 17/02* (2013.01); *G01R 27/2611* (2013.01); *G01R 31/2829* (2013.01)

(58) Field of Classification Search
CPC ............ G01R 27/2605; G01R 27/2611; G01R 27/26; G01R 31/2829; G01D 18/00
See application file for complete search history.

(56) References Cited

U.S. PATENT DOCUMENTS

2005/0104604 A1* 5/2005 Mellert ............... G01N 27/228
324/678
2005/0134292 A1* 6/2005 Knoedgen ............. G01D 5/241
324/658
(Continued)

FOREIGN PATENT DOCUMENTS

DE    38 18 371 A1    12/1989
DE    195 20 948 A1    12/1995
(Continued)

OTHER PUBLICATIONS

International Search Report for Application No. PCT/DE2018/200022, dated May 23, 2018, 3 pages.
(Continued)

*Primary Examiner* — Dominic E Hawkins
(74) *Attorney, Agent, or Firm* — Seed IP Law Group LLP (57) ABSTRACT

An evaluation circuit, system, and method for evaluating a capacitive or inductive sensor includes first and second measurement connections to which sensors and/or reference elements are connected, first and second charging and discharging circuits that respectively output first and second charging and discharging signals to the first and second measurement connections. A comparator circuit compares the temporal behavior of the first and second charging and discharging signals. An integrator circuit produces an output voltage that changes as a function of the voltage at the output of the comparator circuit. The output voltage of the integrator circuit is connected to the first or second measurement connection to adjust the respective first or second charging and discharging signal. A measurement signal derived from the output voltage of the integrator circuit is a measure of impedance differences between the sensors or reference elements at the first and second measurement connections.

20 Claims, 4 Drawing Sheets

(51) Int. Cl.
    *G01R 17/02*     (2006.01)
    *G01R 31/28*     (2006.01)

(56) References Cited

U.S. PATENT DOCUMENTS

| | | | |
|---|---|---|---|
| 2008/0116904 A1* | 5/2008 | Reynolds | G06F 3/04166 |
| | | | 324/678 |
| 2008/0303536 A1 | 12/2008 | Uhov et al. | |
| 2010/0259284 A1 | 10/2010 | Winkens | |
| 2015/0028895 A1* | 1/2015 | Tseng | G06F 3/044 |
| | | | 324/679 |

FOREIGN PATENT DOCUMENTS

| | | |
|---|---|---|
| DE | 10 2014 216 998 A1 | 3/2016 |
| EP | 0 166 706 A1 | 5/1985 |
| EP | 1 860 776 A2 | 5/2007 |

OTHER PUBLICATIONS

International Preliminary Report on Patentability for Application No. PCT/DE2018/200022, dated Oct. 8, 2019, 8 pages.

\* cited by examiner

EVALUATING CIRCUIT, SYSTEM, AND METHOD FOR EVALUATING A CAPACITIVE OR INDUCTIVE SENSOR

BACKGROUND

Technical Field

The present disclosure relates to an evaluation circuit for evaluating a capacitive or inductive sensor, and to a corresponding system and method.

Description of the Related Art

Capacitive and inductive sensors are used in many fields of technology. Such sensors are typically used to determine the distance or the position of a measured object or its change relative to the sensor. Use is made here of the fact that measured objects have a feedback effect on the sensor or its elements. This feedback usually results in a measurable change in the impedance of the sensor or of a sensor element of the sensor. If, for example, a conductive measured object approaches an inductive sensor operating on the eddy current principle, a magnetic field emitted by the sensor will induce eddy currents in the measured object. These eddy currents counteract the change in the magnetic field, so that the inductance of the sensor coil and thus its impedance changes. A non-conductive measured object approaching a capacitive sensor acts as a dielectric and thereby increases the capacitance of the sensor. This in turn leads to a change in the impedance of the sensor. The same applies to other technologies of capacitive and inductive sensors.

Such impedance changes are not usually directly usable. The impedance changes are instead converted by an evaluation circuit into a measurement signal, which can then be further processed. The sensor elements of the sensor are frequently supplemented by circuit elements to form a parallel or series resonant circuit, and an AC voltage applied to the resonant circuit. If a measured object approaches the influence range of the sensor, the resonant circuit will be detuned, which leads to a detectable phase shift between the resonant circuit signal and the excitation signal. A disadvantage here is that this introduces further dependencies, such as, for example, dependencies on the length of a connecting cable, temperature dependencies and additional component tolerances. Furthermore, the components necessary for forming the resonant circuit must be arranged close to the sensor, which is not possible in all application scenarios.

Other evaluation circuits take a differential approach in which the impedances of two sensor elements of a sensor or of one sensor element of a sensor are compared with a reference element. Such a circuit is known, for example, from EP 0 166 706 A1. An oscillator is alternately switched to a reference capacitor and to a sensor capacitor by means of switches. The control signal of the switches is formed by a frequency divider from the oscillations of the oscillator, the edges of which are conditioned by a Schmitt trigger. The control signal for the switches is converted into a differential signal by a conditioning circuit and output as a differential output signal of the circuit.

DE 38 18 371 A1 discloses an evaluation circuit for a differential inductive transmitter with two sensor coils, wherein the sensor coils can be supplemented by a common capacitor to form an LC resonant circuit. The two sensor coils have a common connection which is connected to one of two connections of an oscillator. The second connection of the oscillator is connected to a switching device which connects the oscillator alternately to the second connection of one of the two sensor coils. One of the two sensor coils is thereby alternately excited to oscillate.

A disadvantage of these evaluation circuits is that a switching element is required, which increases costs and the susceptibility of the circuit to errors.

BRIEF SUMMARY AND INITIAL DESCRIPTION

Disclosed herein is an evaluation circuit, a system and a method that provide a reliable and cost-effective differential evaluation of a capacitive or inductive sensor.

According to at least one embodiment, disclosed herein is an evaluation circuit that comprises:
a first and a second measurement connection, wherein the first measurement connection is designed to connect a first sensor element of the sensor and the second measurement connection is designed to connect a second sensor element of the sensor or of a reference element,
a charging and discharging circuit which is designed to output a first charging and discharging signal to the first measurement connection and to output a second charging and discharging signal to the second measurement connection,
a comparator circuit which compares the temporal behavior of the first charging and discharging signal with the temporal behavior of the second charging and discharging signal, and
an integrator circuit which is connected to an output of the comparator circuit and the output voltage of which changes as a function of the voltage at the output of the comparator circuit,
wherein the output voltage of the integrator circuit is connected to the first measurement connection in order to adjust the first charging and discharging signal or to the second measurement connection in order to adjust the second charging and discharging signal, and
wherein a measurement signal at an output of the evaluation circuit is derived from the output voltage of the integrator circuit and wherein the measurement signal is a measure of the deviation of the impedances of the first and the second sensor element or of the impedances of the first sensor element and the reference element.

As regards the system, according to at least one embodiment, the system comprises a first and a second evaluation circuit as disclosed herein, and further comprises:
a first capacitive or inductive sensor having two sensor elements, and
a reference element,
wherein the first sensor element of the first sensor is connected to a first measurement connection of the first evaluation circuit and the second sensor element of the first sensor is connected to a second measurement connection is the first evaluation circuit,
wherein the reference element is connected to a second measurement connection of the second evaluation circuit, and
wherein the first measurement connection of the second evaluation circuit is connected to the first and the second measurement connections of the first evaluation circuit in each case via a coupling resistor.

As regards the method, according to at least one embodiment, the method comprises the steps of:
- generating a first and a second charging and discharging signal,
- repeatedly charging and discharging a first sensor element of the sensor by means of the first charging and discharging signal,
- repeatedly charging and discharging a second sensor element of the sensor or of a reference element by means of the second charging and discharging signal,
- comparing the temporal behavior of the first charging and discharging signal with the temporal behavior of the second charging and discharging signal,
- changing an output voltage of an integrator circuit as a function of the result of the comparison of the temporal behavior,
- adapting the first charging and discharging signal and/or the second charging and discharging signal as a function of the output voltage of the integrator circuit, and
- deriving and outputting a measurement signal from the output voltage of the integrator circuit as a measure of the difference between the impedances of the first and the second sensor elements or between the impedances of the first sensor element and the reference element.

It has first been recognized in the manner according to the present disclosure that an (analog) measurement signal can be generated by a relatively simple control loop, which signal forms a measure of the difference between two impedances, namely of a first sensor element relative to a second sensor element or a first sensor element relative to a reference element. In this case, use is made of the fact that the temporal behavior of a charging and discharging signal which is given to an inductor is dependent on the impedance. In the case of a capacitor, the charging and discharging behavior depends on the size of the capacitor: the higher the capacitance, the more slowly the capacitor will be charged to a maximum voltage value. Conversely, the lower the capacitance, the more quickly the capacitor will discharge. The same also applies to a coil in which the current through the coil rises faster or more slowly in the case of a voltage jump depending on the inductance of the coil. Thus, if the temporal behavior of two inductors in response to an excitation signal is compared, this will give a measure of the differences between the impedances.

According to the present disclosure, a first and a second charging and discharging signal are therefore generated by means of a charging and discharging circuit and are output to measurement connections of the evaluation circuit. The first charging and discharging signal is output to a first measurement connection and the second charging and discharging signal is output to a second measurement connection. The first measurement connection is designed to connect a first sensor element of the sensor. Either a second sensor element of the sensor or a reference element can be connected to the second measurement connection. The charging and discharging circuit is switched off such that the first and second charging and discharging signals each have a dependence on the inductors which are connected to the first and second measurement connections respectively. In practice, this dependency will usually consist of the temporal behavior of the charging and discharging signal being influenced. For example, when a square-wave signal forms an excitation signal, the edges of the square-wave signal will be flattened by the connected impedance. The higher the impedance, the more marked will be the flattening. As a result, the charging and discharging signal changes as a function of the connected impedance.

To exploit these dependencies, the evaluation circuit comprises a comparator which compares the temporal behavior of the first charging and discharging signal with the temporal behavior of the second charging and discharging signal. Depending on the result of the comparison, the comparator outputs a result signal which is representative of the relative temporal behavior. This result signal will usually be a binary signal, i.e., the signal can assume two levels. In this case, the first level indicates that the first charging and discharging signal rises and/or falls faster than the second charging and discharging signal. Accordingly, the second level indicates that the second charging and discharging signal rises and/or falls faster than the first charging and discharging signal. The result signal is then fed to an integrator circuit which adds up the comparison results. A voltage which is representative of the number of increments of increase of the integrator circuit is then present at the output of the integrator circuit.

To prevent the increase in the output voltage from rising indefinitely, the output voltage is connected to one of the measurement connections. As a result, the charging and discharging signal is superimposed with a DC voltage level, so that the charging and discharging signal is shifted to positive or to negative voltages, depending on the configuration of the circuit. This in turn shifts the time at which a specific level of the charging and discharging signal is reached. This makes it possible for the result signal from the comparator circuit to change and thus to assume the second level instead of the first level (or vice versa). As a result, the output voltage is no longer further increased. In this way, the voltage at the output of the integrator circuit is a measure of how strongly the impedances at the first and the second measurement connection differ from each other. The evaluation circuit according to the present disclosure is inexpensive and provides good results even with very low impedances of the sensor elements. Furthermore, dependencies of temperature and of cable lengths can be easily eliminated if the cables between the measurement connections and the sensor elements are of approximately equal length and are routed close to one another. Since the integrator circuit and the comparator circuit do not require any precision components, but can instead be constructed with standard components, the result is a cost-effective evaluation circuit.

It should be pointed out that the use of the designations "first measurement connection" and "second measurement connection" merely serves to distinguish the two measurement connections. Since the circuit is constructed substantially symmetrically, it is irrelevant which of the inductors (i.e., a first sensor element, a second sensor element or the reference element) is connected to which measurement connection. This applies irrespective of whether an evaluation circuit is a single unit or a plurality of evaluation circuits are interconnected to form a system.

It should also be noted that a reference element can be formed by the most varied components. In this case, it is essential that the reference element—in contrast to the sensor element(s)—is not influenced by the measured object. Furthermore, in order to simplify the evaluation, the reference element should be of the same category as the sensor, i.e., if a capacitive sensor is to be evaluated, the reference element would be formed by a capacitor; if an inductive sensor is to be evaluated, the reference element would be formed by an inductor. In this case, it is furthermore advantageous if the reference element has a high temperature stability or if the behavior of the reference element with regard to temperature changes is equal to or at least similar to that of the sensor. Although this is not essential for the accuracy of the output measurement signal, it does not insignificantly reduce the effort involved in processing the measurement signal. The use of precision components for the reference element is also advantageous, even if not essential. Tolerances in the reference element can in principle be compensated by calibration measurements. However, by using a precision component, calibration measurements can be significantly simplified or even dispensed with completely. Furthermore, the reference element may have a fixed value or may be configured as an adjustable coil or capacitor. In this case, adaptability can be implemented using a wide variety of methods known from practice. Manually adjustable reference elements can also be used as also electronically adjustable reference elements.

In a preferred development, the evaluation circuit additionally has an inverting circuit which is preferably formed by an inverting amplifier. The output voltage of the integrator circuit is input into this inverting circuit. From this input voltage the inverting circuit generates an output voltage which represents a mirroring of the input voltage at a reference voltage. For example, if the reference voltage has a value of 2.5 volts and the output voltage of the integrator circuit has a value of 3 volts, the inverting circuit would mirror this value at the reference voltage, i.e., the output voltage of the inverting circuit would be at the same distance from the reference voltage, but would be "on the other side" of the reference voltage. The output voltage of the inverting circuit would then assume a value of 2 volts in this example. When the output voltage of the integrator circuit increases, the output voltage of the inverting circuit decreases and vice versa. The output voltage of the inverting circuit thus changes relative to the reference voltage and in the opposite direction with respect to the output voltage of the integrator circuit. In an implementation of the inverting circuit as an inverting amplifier using an operational amplifier, this aspect can be realized by inputting the output voltage of the integrator circuit into the inverting input of the operational amplifier and the reference voltage into the non-inverting input of the operational amplifier.

A first preferred use of this inverting circuit is to increase the level of the measurement signal. In this case, the measurement signal would be tapped by the voltage between the output of the integrator circuit and the output of the inverting circuit. As a result, when the output voltage at the integrator circuit changes, the voltage swing increases to twice the value.

A second preferred use of this inverting circuit is for the output voltage of the inverting circuit to be used to adjust one of the two charging and discharging signals. When the output voltage of the integrator circuit is connected to the first measurement connection, the output voltage of the inverting circuit would be connected to the second measurement connection in order to adjust the second charging and discharging signal. Conversely, in order to adjust the first charging and discharging signal, the output voltage of the inverting circuit would be connected to the first measurement connection when the output voltage of the integrator circuit is connected to the second measurement connection. In this way, adjustment of the charging and discharging signal can be improved.

To improve the comparison result of the comparator circuit, the evaluation circuit can have a first and a second binarization circuit, wherein the first binarization circuit is connected to the first measurement connection and the second binarization circuit is connected to the second measurement connection. The output voltages of the binarization circuits would then be input into the comparator circuit. Preferably, the two binarization circuits are each implemented by Schmitt trigger circuitry. Integrated circuits are available in which two such binarization circuits are integrated on a single chip. As a result, the behavior of the two binarization circuits with regard to input capacitance, threshold voltage, delay time, temperature influence and/or further characteristics is virtually identical. The first and second binarization circuits thus represent the signals at the first and second measurement connection into a binary signal in a largely identical manner, i.e., a signal which assumes a first or a second level and in which the change between the two levels is effected quickly, usually in the range of a few milliseconds or less. Common binarized signals are, for example, a bipolar square-wave signal alternating between a positive first level (e.g., +5 V) and a negative second level (e.g., −5 V), or a unipolar square-wave signal alternating between two positive levels, two negative levels, or a positive/negative level and 0 V. Common unipolar square-wave signals assume, for example, levels of +5 V or 0 V.

In a preferred development, the comparator is formed by a flip-flop. D flip-flops have proven to be particularly suitable. Here one of the two charging and discharging signals is input into the clock input and the other of the two charging and discharging signals is input into the data input. If binarization circuits are used, the output of the first binarization circuit can be connected to the clock input of the D flip-flop and the output of the second binarization circuit can be connected to the data input of the D flip-flop, without loss of generality. A D flip-flop is mostly edge-triggered and outputs the level present at the data input to the output in the case of a rising edge at the clock input. If the temporal behavior of the inductor at the first measurement connection is now faster than that of the inductor at the second measurement connection, a low level will still be present at the data input in the case of a rising edge at the clock input. In this case, a low level is thus present at the non-inverting data output of the D flip-flop. If the temporal behavior of the inductor at the second measurement connection is faster than that of the inductor at the first measurement connection, a low level will still be present at the data input in the case of a rising edge at the clock input. In this case, a low level is thus present at the non-inverting data output of the D flip-flop.

The integrator circuit can in principle be implemented in various ways. However, a preferred integrator circuit is implemented as an operational amplifier circuit. Such integrator circuits are well-known in practice. In the simplest case, the output of the operational amplifier is fed back via a capacitor to the inverting input. The input of the integrator circuit is formed by the inverting input of the operational amplifier, so that the output signal of the comparator circuit in this development is connected to the inverting input of the operational amplifier.

In a particularly preferred refinement, the non-inverting input of the operational amplifier, which is connected as an integrator circuit, is charged with a voltage not equal to 0 V, particularly preferably a voltage greater than 0 V. In this way, the output voltage of the integrator circuit can be provided with an offset. In this case, this voltage at the non-inverting input is preferably generated by a voltage divider from a supply voltage of the evaluation circuit. Depending on the selection of the ratio of the resistances of the voltage divider, the offset voltage can be shifted. The two resistors of the voltage divider preferably have approximately the same values, so that the offset voltage equals half the supply voltage. The resistors of the voltage divider are preferably precision resistors and have a tolerance of 1% or less.

The evaluation circuit preferably has a clock input into which a clock signal can be input. This clock input can be connected to the charging and discharging circuit and can be used to generate the first and second charging and discharging signals. In this case, in the simplest development, the charging and discharging circuit can be formed by a resistor or an interconnection of a plurality of resistors. In this way, it is possible on the one hand to generate a periodic charging and discharging signal and on the other hand to ensure that the charging and discharging signal remains influenced by an inductor connected to the measurement connection.

In a first embodiment, a clock signal can be formed by an external clock circuit, preferably an external oscillator, i.e., by a clock circuit which does not form part of the relevant evaluation circuit. In a second and preferred development, the evaluation circuit has a clock circuit whose output is connected to the clock input of the evaluation circuit. The clock circuit can be formed by a simple oscillator. If both charging and discharging signals are derived from a common clock signal, no special requirements with regard to clock stability need apply to the oscillator, since both inductors connected to the measurement connection are affected by the same fluctuation of the frequency and/or the same jitter, and the errors are thus compensated.

In principle, the evaluation circuit according to the present disclosure can be used as a single unit for evaluating a sensor element relative to another sensor element or relative to a reference element. However, particular effects result if a plurality of evaluation circuits are interconnected to form a system for evaluating a capacitive or inductive sensor.

Such a system according to the present disclosure has a first evaluation circuit, a second evaluation circuit, a first capacitive or inductive sensor and a reference element. In principle, it would be conceivable to form the first and second evaluation circuit by means of a relatively arbitrary evaluation circuit known from the prior art. However, the system functions particularly well if the two evaluation circuits are formed by evaluation circuits according to the present disclosure. The evaluation circuits each have a first and a second measurement connection. A first sensor element of the first sensor is connected to the first measurement connection of the first evaluation circuit and a second sensor element of the first sensor is connected to the second measurement connection of the first evaluation circuit. The reference element is connected to the second measurement connection of the second evaluation unit. The first measurement connection of the second evaluation unit is used to couple the two evaluation units together. The first measurement connection of the second evaluation unit is connected to the first measurement connection of the first evaluation unit by a first coupling resistor and to the second measurement connection of the first evaluation unit by a second coupling resistor. In this way, changes in the impedances of the first and second sensor elements of the first sensor affect not only the measurement signal of the first evaluation circuit, but additionally the measurement signal of the second evaluation circuit. The measurement signal of the first evaluation circuit thus represents a difference between the impedances of the first and the second sensor elements of the first sensor, while the measurement signal of the second evaluation circuit represents a difference of both sensor elements relative to the reference element.

If, for example, the sensor is a capacitive distance sensor having two electrodes, then the measurement signal of the first evaluation circuit represents the position of a measurement object relative to the two sensor elements (the electrodes): The further the measurement object moves away from a central position between the two electrodes, the further the measurement signal will also move away from a central position, for example a voltage of 0 volts. On the other hand, the measurement signal of the second evaluation circuit indicates how great is the influence of the measurement object on both electrodes. When the measurement object and/or its electrical properties are known, the distance of the measurement object relative to the electrodes can thus be deduced from the second measurement signal.

In a further development of this system according to the present disclosure, the system additionally has a third evaluation circuit and a second capacitive or inductive sensor. The third evaluation circuit is in turn preferably formed by an evaluation circuit according to the disclosure. The second sensor is preferably of the same category as the first sensor, i.e., if the first sensor is a capacitive sensor, the second sensor would also be a capacitive sensor; if the first sensor is formed by an inductive sensor, the second sensor would also be an inductive sensor. A first measurement connection of the third evaluation circuit is connected to a first sensor element of the second sensor and a second measurement connection of the third evaluation circuit is connected to a second sensor element of the second sensor. The first measurement connection of the third evaluation circuit is additionally connected to the first measurement connection of the second evaluation circuit by a third coupling resistor and the second measurement connection of the third evaluation circuit is connected to the first measurement connection of the second evaluation circuit by a fourth coupling resistor. In this way, the third evaluation circuit is additionally coupled to the second evaluation circuit. In this system, the measurement signal of the first evaluation circuit then furthermore represents the difference between the impedances of the two sensor elements of the first sensor. The measurement signal of the third evaluation circuit represents the difference between the impedances of the two sensor elements of the second sensor. The measurement signal of the second evaluation circuit represents the difference between the impedances of all four sensor elements and the reference element.

In a preferred development of a system with two sensors, the sensor elements of the first sensor and the sensor elements of the second sensor are each constructed symmetrically to one another. The symmetry preferably takes the form of an axis symmetry. Particularly preferably, the axis of symmetry of the sensor elements of the first sensor is arranged perpendicular to the axis of symmetry of the sensor elements of the second sensor.

In the evaluation of capacitive sensors, in a system with two sensors, the individual sensor elements—the electrodes of the sensors—are preferably formed by circular arcs or circular segments. The circular arcs of the individual sensor elements preferably form a circular line with four breaks or a circular area divided into four parts.

In the combination of both developments, i.e., sensor elements with perpendicular axes of symmetry and circular arcs or circular segments as sensor elements of the two sensors, four identically designed circular arcs or circular segments arise, the electrodes of the two sensors alternating in each case. This development of the electrodes provides a further advantage. The system forms a 3D sensor system: the measurement signals of the first and third evaluation circuits represent the positional deviation of a measurement object from the circle center, while the measurement signal of the second evaluation circuit represents the distance of the measurement object on a plane parallel to the electrodes. In this case, the measurement signal of the first evaluation circuit reflects a positional deviation in the direction of the axis of symmetry of the second sensor and the measurement signal of the second evaluation circuit reflects a positional deviation of the measurement object in the direction of the axis of symmetry of the first sensor. The position and/or the change in position of a measurement object can thus be detected in three dimensions.

Such a sensor system can be used in various ways. It would thus be conceivable for this sensor system to be used as a three-dimensional input device. A user could move an object held in a central position, out of the three-dimensional central position, doing so for example by means of springs, and thus could specify a direction in three dimensions. This can be used, for example, in virtual reality systems. However, it would also be conceivable for the sensor system to be used in a production environment, for example, in order to check the position of a production piece in a work step. Another application scenario could be that a position of a measurement object is to be held and deviations from the desired position be determined by means of the sensor system. These few examples already reveal how universally this sensor system can be used. A person skilled in the art can readily recognize which further application scenarios result for the system.

For synchronization of the individual evaluation circuits, the system preferably has a clock circuit, which is preferably formed by an oscillator. A clock signal generated by the clock circuit would then be input into a clock input of the respective evaluation circuits. In this way, it is ensured that the individual charging and discharging signals can be correctly set in a temporal relationship to one another. In this case, such a clock circuit can be formed by an external circuit, i.e., a clock circuit which is not part of one of the evaluation circuits. In a preferred development, however, the clock circuit forms part of one of the evaluation circuits. A clock output of this clock circuit would then be connected to the clock input of each evaluation circuit, also to the evaluation circuit containing the clock circuit. In principle, in this development it is conceivable for only one of the evaluation circuits to have a clock circuit. However, since the clock circuit will consist of very few elements and thus only entail insignificant additional costs, preferably each of the evaluation circuits will have a clock circuit, wherein only one of the clock circuits is activated. This permits universal use of the evaluation circuits.

The following method steps are carried out during operation of an evaluation circuit according to at least one embodiment of the disclosure:

generating a first and a second charging and discharging signal, repeatedly charging and discharging a first sensor element of the sensor by means of the first charging and discharging signal, repeatedly charging and discharging a second sensor element of the sensor or of a reference element by means of the second charging and discharging signal, comparing the temporal behavior of the first charging and discharging signal with the temporal behavior of the second charging and discharging signal, changing an output voltage of an integrator as a function of the result of the comparison of the temporal behavior, adjusting the first charging and discharging signal or the second charging and discharging signal as a function of the output voltage of the integrator, and deriving and outputting a measurement signal from the output voltage of the integrator as a measure of the difference between the impedances of the first and the second sensor elements or the impedances of the first sensor element and the reference element.

It will be appreciated that these steps can also be carried out when the evaluation circuit has an inverting circuit or is part of a system according to the present disclosure.

BRIEF DESCRIPTION OF THE SEVERAL VIEWS OF THE DRAWINGS

There are various options for advantageously designing and developing the teaching of the present disclosure. In this regard, with the aid of the drawings, reference is made, on the one hand, to the claims subordinate to the subordinate claims and, on the other hand, to the following explanation of preferred exemplary embodiments of the disclosure. Generally preferred designs and developments of the teaching are also explained in conjunction with the explanation of the preferred exemplary embodiments of the disclosure with reference to the drawings. The drawings show the following:

DETAILED DESCRIPTION

Figure 1:
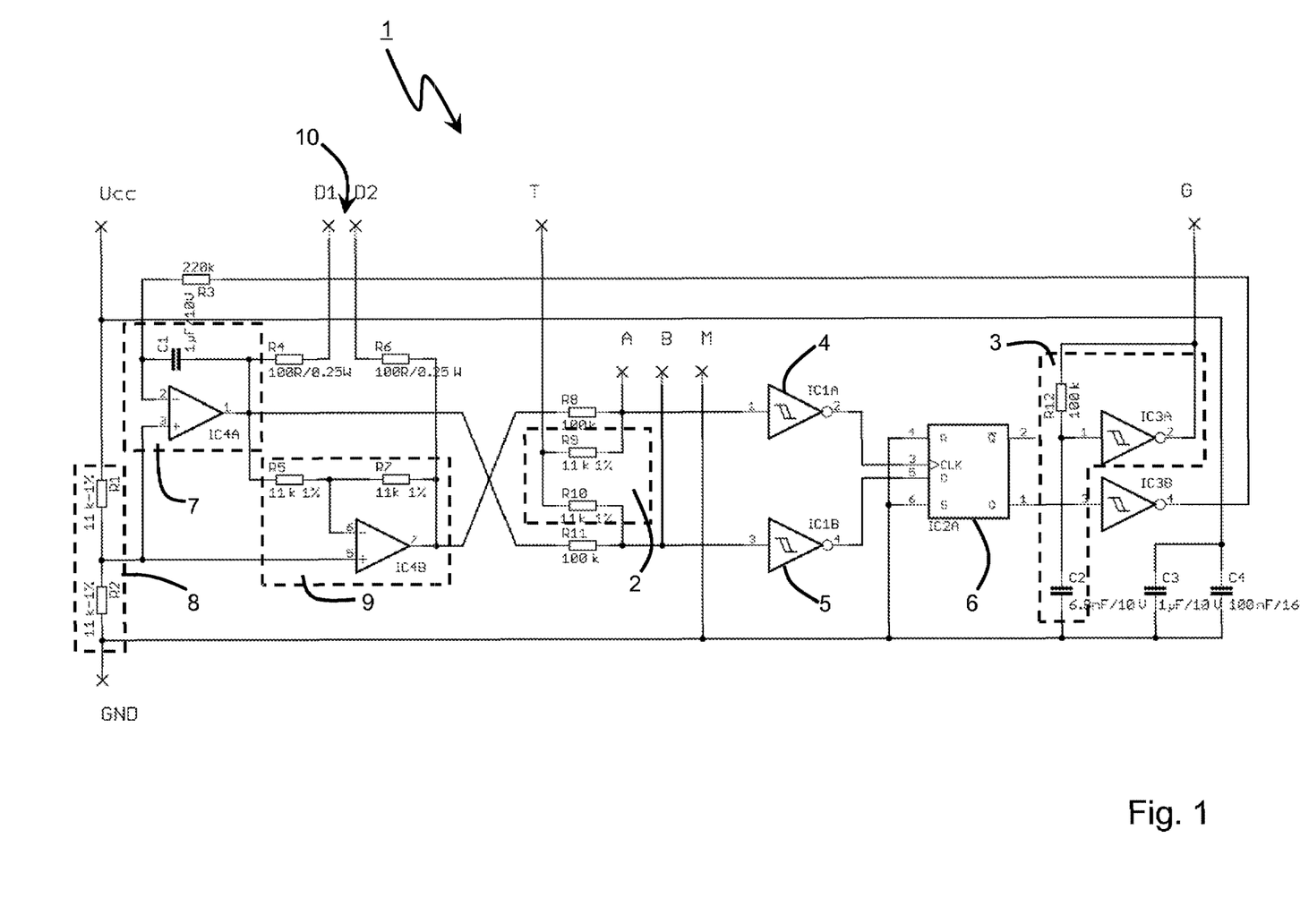
FIG. 1 is a circuit diagram of an exemplary embodiment of an evaluation circuit according to the present disclosure.

FIG. 1 shows a circuit diagram of an exemplary embodiment of an evaluation circuit according to the present disclosure. It should be expressly pointed out that both the values of resistors or capacitors used there and also the topology of the individual circuit elements should be regarded merely as an exemplary dimensioning and configuration of the evaluation circuit. A person skilled in the art will recognize how adaptations can be made and what effect these adjustments will have.

The evaluation circuit according to FIG. 1 has a first measurement connection A and a second measurement connection B, to each of which one of two sensor elements of a sensor can be connected. If the sensor is an inductive sensor, the two sensor elements would be formed by coils of the sensor. If the sensor is a capacitive sensor, the two sensor elements would be formed by measuring electrodes of the sensor. The measurement connections A, B are connected to a charging and discharging circuit 2, which in this simple case is formed only by a resistor R9 and a resistor R10. The connections of the resistors R9, R10 at the opposite end to the measurement connections A, B are jointly connected to a clock input T. A clock signal is input into this clock input T, which in this exemplary embodiment is generated by a clock circuit 3 and output at a clock output G. The clock circuit 3 consists of a simple oscillator consisting of an inverting Schmitt trigger IC3A, a capacitor C2 and a resistor R12.

The first measurement connection A is further connected to a first binarization circuit 4 and the second measurement connection B is connected to a second binarization circuit 5.

The two binarization circuits 4, 5 are in each case implemented by an inverting Schmitt trigger IC1A and IC1B, wherein the identical characters at the beginning of their designations is intended to indicate that the two Schmitt triggers are jointly integrated on one chip. At the same time, this means that the two Schmitt triggers behave similarly and in particular have approximately identical switching thresholds. The outputs of the binarization circuits 4, 5 are connected to inputs of a comparator circuit 6.

In the illustrated embodiment, the comparator circuit 6 is implemented by a D flip-flop IC2A, wherein the output of the first binarization circuit 4 is connected to the clock input CLK of the D flip-flop IC2A and the output of the second binarization circuit 5 is connected to the data input D of the D flip-flop IC2A. The set and reset connections R, S of the D flip-flop IC2A are in each case grounded. The non-inverted data output Q of the D flip-flop IC2A is connected to a further inverting Schmitt trigger IC3B, the output of which is connected via a resistor R3 to an integrator circuit 7.

The integrator circuit 7 is implemented by an operational amplifier IC4A, the output of which is fed back via a capacitor C1 to the inverting input of the operational amplifier IC4A. The signal from the inverting Schmitt trigger IC3B is also input into the inverting input of the operational amplifier IC4A via the resistor R3. The non-inverting input of the operational amplifier IC4A is connected to the center tap of a voltage divider 8 which consists of two resistors R1 and R2 identically dimensioned here and is connected between a supply voltage Ucc of the evaluation circuit 1 and ground. The output of the operational amplifier IC4A simultaneously forms the output of the integrator circuit 7.

The output of the integrator circuit 7 is connected to an input of an inverting circuit 9 which in this development is formed by an operational amplifier IC4B which is connected as an inverting amplifier. The circuit elements of the operational amplifier IC4B are formed by resistors R5 and R7 which are precision resistors and set an amplification of −1. The non-inverting input of the operational amplifier IC4B is also connected to the center tap of the voltage divider 8. The output of the operational amplifier IC4B simultaneously forms the output of the inverting circuit 9.

The output of the integrator circuit 7 and the output of the inverting circuit 9 are connected to the measurement output 10 of the evaluation circuit 1 via the resistors R4 and R6. The pins of the measuring output 10 are labeled D1 and D2. The resistors R4 and R6 essentially serve for limiting the current and are thus protective resistors.

The output of the integrator circuit 7 is connected via a resistor R11 to the second measurement connection B. The output of the inverting circuit 9 is connected to the first measurement connection A via a resistor R8.

In addition, the evaluation circuit 1 has a ground connection M which provides a connection to ground. In addition, capacitors C3 and C4 are present, which serve to stabilize the supply voltage Ucc.

When the evaluation circuit 1 is in operation, the clock circuit 3 generates a square-wave signal which is input into the charging and discharging circuit 2 at the clock input T. This produces a first and second charging and discharging signal which is output via the first and second measurement connection to a first sensor element or a second sensor element or a reference element. The inductor (not shown here) connected externally in each case to the first or second measurement connection generates a change in the temporal behavior of the respective charging and discharging signals. The first and second charging and discharging signals influenced thereby are each converted via the first and second binarization circuit 4, 5 into a square-wave signal, which changes between a first and a second level. The square-wave signal output in each case reflects when the charging and discharging signal exceeds a first threshold value or falls below a second threshold value. Since inverting Schmitt triggers are used, a rising edge of the square-wave signal means that the second threshold value has been undershot by the charging and discharging signal, while a falling edge of the square-wave signal indicates the time at which the first threshold value is exceeded by the input charging and discharging signal.

The square-wave signals generated by the first and second binarization circuits produce the following behavior in the D flip-flop IC2A: since the binarization circuits are formed by inverting Schmitt triggers, and since the D flip-flop reacts to rising edges at the clock input CLK, the discharge branches of the inductors at the measurement connection A, B are evaluated by the comparator circuit. If the inductor externally connected to measurement connection A is discharged faster below the threshold value than the inductor at measurement connection B, the level of the output signal of the first binarization circuit 4 will change to a high level, while the level at the output of the second binarization circuit 5 will remain low. In this way, a low level is connected to the non-inverted output Q of the D flip-flop in the case of a rising edge at the clock input CLK. If the inductor externally connected to the measurement connection B is discharged faster below the threshold value than the inductor at the measurement connection A, the level of the output signal of the second binarization circuit 5 will change to a high level, while the level at the output of the first binarization circuit 4 will remain low. If the inductor externally connected to measurement connection A is also discharged below the threshold value, a rising edge will be produced at the output of the first binarization circuit 4 so that the high level at the data input D is connected to the non-inverted data output Q. A low level at the data output Q of the flip-flop IC2A thus indicates that the inductor externally connected to measurement connection A is discharged faster than the inductor externally connected to measurement connection B, while a high level indicates that the inductor externally connected to measurement connection B is discharged faster.

Due to the inverting Schmitt trigger IC3B, a high level is present at the input of the integrator circuit 7 when the inductor externally connected to measurement connection A is discharged faster. A low level is present when the inductor externally connected to measurement connection B is discharged faster. In the discharged state of the capacitor C1, half the supply voltage $U_{cc}$ is present at the output of the integrator circuit 7 due to the voltage at the non-inverting input of operational amplifier IC4A. The behavior of the integrator circuit 7 now depends on how the output voltage of the inverting Schmitt trigger IC3B looks. In the simplest case, a voltage which changes between a positive voltage (usually $U_{cc}$) and 0 V is output by the inverting Schmitt trigger. By applying a voltage of $U_{cc}/2$ at the non-inverted input of the operational amplifier IC4A and by connecting the operational amplifier IC4A as an inverter integrator, a positive voltage at the input of the integrator circuit 7 lowers the voltage at the output of the integrator circuit. Conversely, the voltage at the output of the integrator circuit increases when a level of 0V is applied to the input of the integrator circuit 7. A faster discharging at the measurement connection A thus reduces the output voltage of the integrator, while a faster discharging at the measurement connection B increases the output voltage of the integrator.

Figure 2:
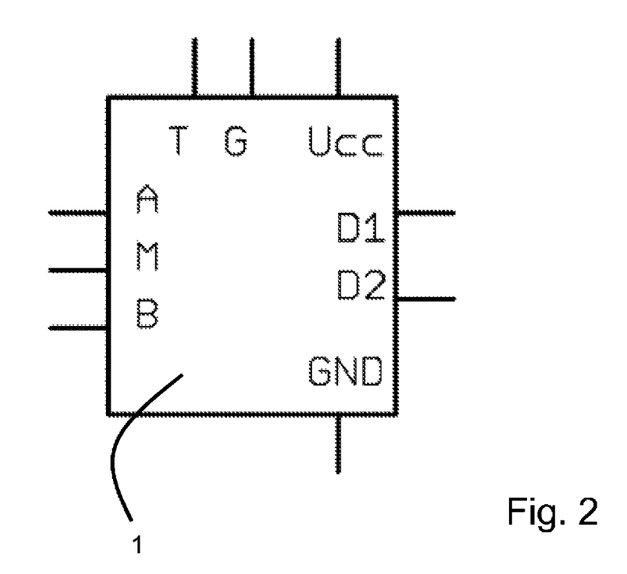
FIG. 2 is a block for a block diagram representing the inventive evaluation circuit according to FIG. 1.

FIG. 2 symbolizes a block which is used in the subsequent block diagrams as an abstraction of the evaluation circuit according to FIG. 1. On its left-hand side, the evaluation circuit 1 has the first and second measurement connections A, B and a ground connection M. A clock input T, a clock output G, and an input for the supply voltage Ucc are shown on the upper side. The poles D1 and D2, which together form the measurement output 10, are shown on the right-hand side. A ground connection GND is shown on the lower side.

Figure 3:
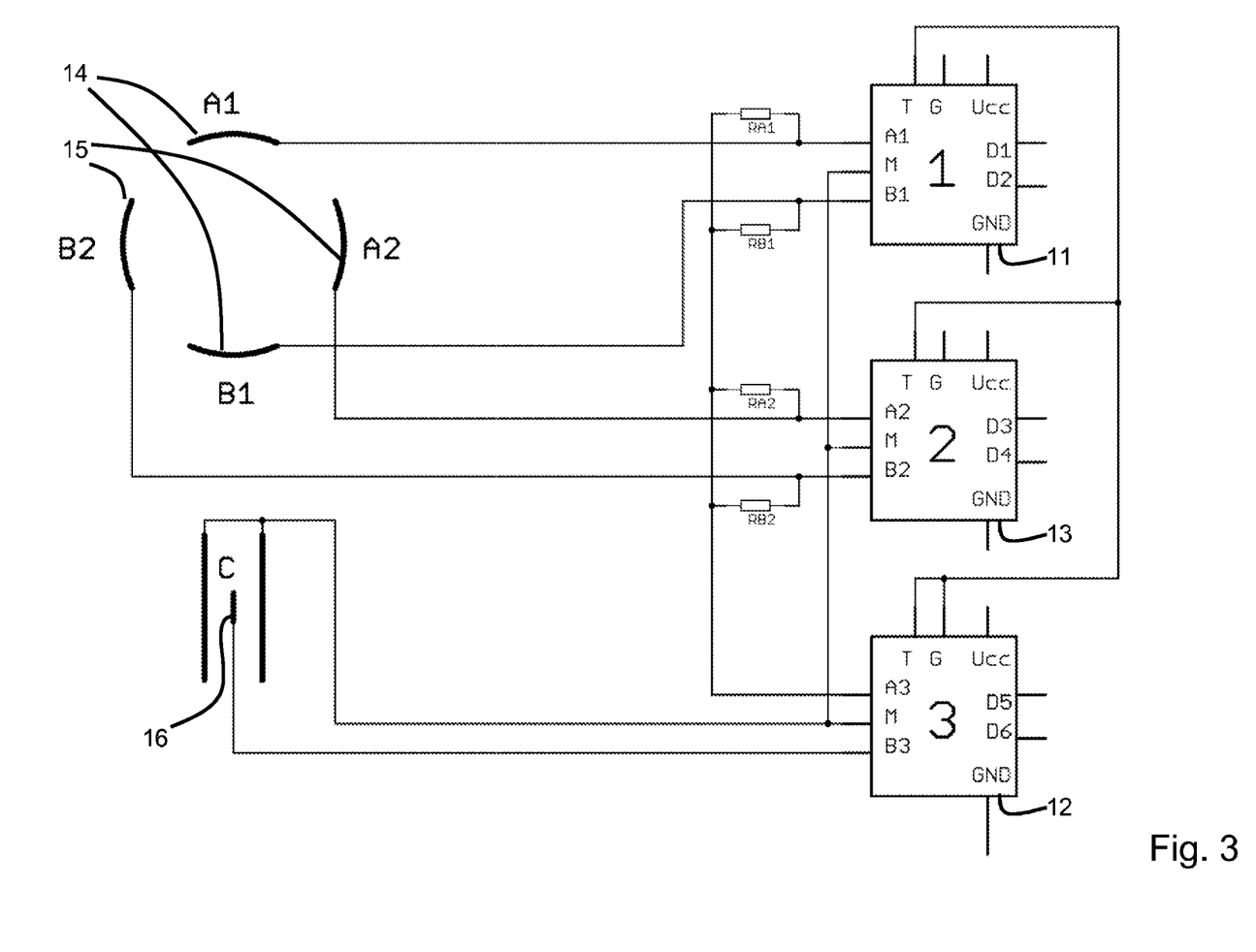
FIG. 3 is a first exemplary embodiment of a system according to the present disclosure with three evaluation circuits and two sensors whose sensor elements are arranged on a circular path.
Figure 4:
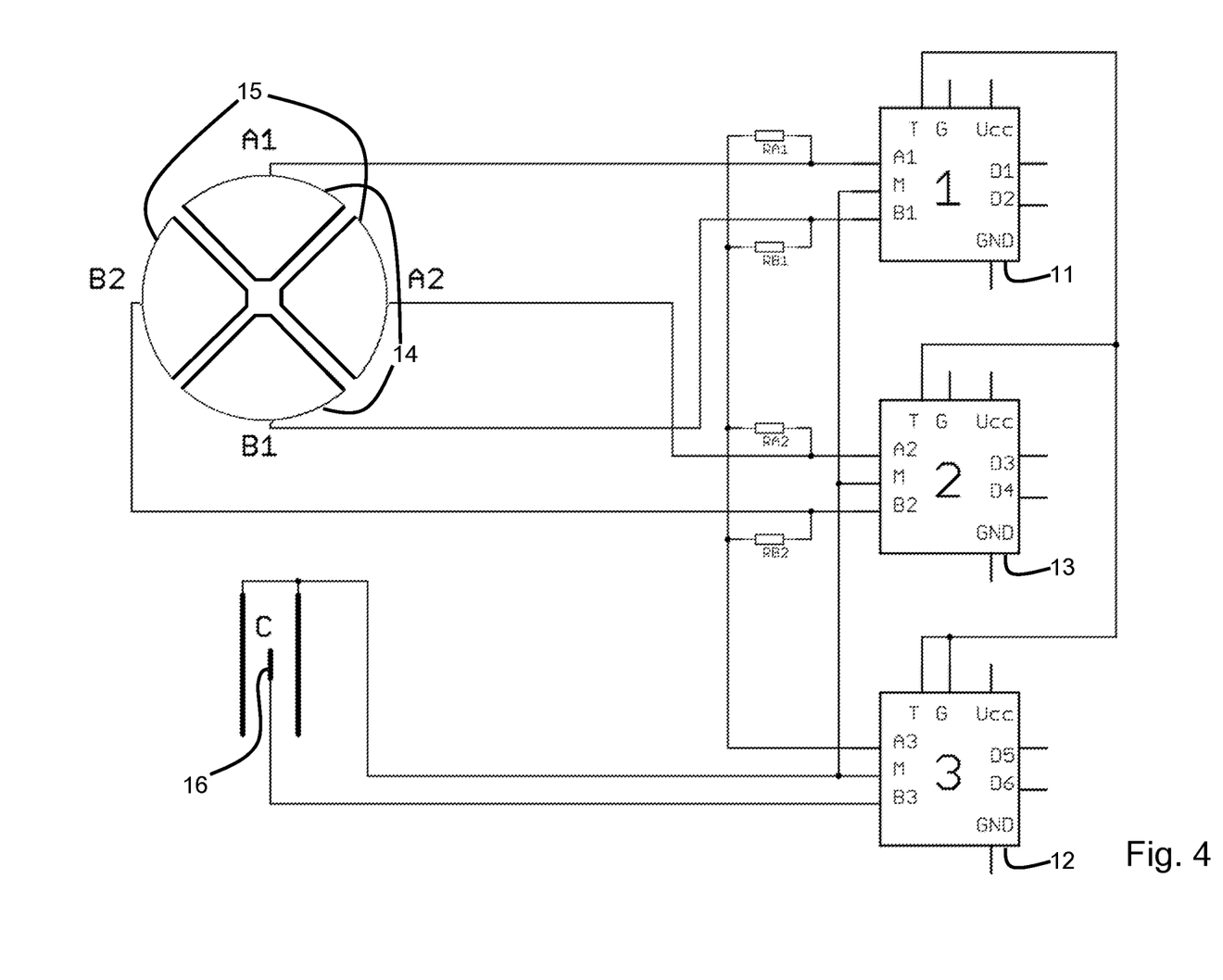
FIG. 4 is a second exemplary embodiment of a system according to the present disclosure with three evaluation circuits and two sensors whose sensor elements are formed by segments of a circle.

This abstraction of the evaluation circuit is used in the block diagrams of FIGS. 3 and 4 which represent two exemplary embodiments of a system according to the present disclosure. The exemplary embodiment according to FIG. 3 comprises a first, a second, and a third evaluation circuit 11, 12, 13 as well as a first and a second sensor 14, 15 and a reference element 16. The electrodes/sensor elements A1, B1 of the first sensor 14 are axis-symmetrical with respect to a horizontal line. The same applies to the sensor elements A2, B2 of the second sensor 15, which are axis-symmetrical with respect to a vertical line. The two axes of symmetry are perpendicular to each other. It can also be seen that the four sensor elements A1, A2, B1, B2 lie on a common circular line and that a sensor element of one sensor always alternates with a sensor element of the other sensor.

The first measurement connection A1 of the first evaluation circuit 11 is connected to a first sensor element A1 of a first sensor 14. The second measurement connection B1 of the first evaluation circuit 11 is connected to a second sensor element B1 of the first sensor 14. The first measurement connection A2 of the third evaluation circuit 13 is connected to a first sensor element A2 of a second sensor 15. The second measurement connection B2 of the third evaluation circuit 13 is connected to a second sensor element B2 of the second sensor 15. The second measurement connection B3 of the second evaluation circuit 12 is connected to a reference element 16. The first measurement connection A3 is connected via a first coupling resistor RA1 to the first measurement connection A1 of the first evaluation circuit 11, via a second coupling resistor RB1 to the second measurement connection B1 of the first evaluation circuit 11, via a third coupling resistor RA2 to the first measurement connection A2 of the third evaluation circuit 13, and via a fourth coupling resistor RB2 to the second measurement connection B2 of the third evaluation circuit 13. The ground connections M of the three evaluation circuits 11, 12, 13 are connected to one another and to the ground electrode of the reference element. The clock circuit of the second evaluation circuit 12 is active, for which reason the clock output G of the second evaluation circuit 12 is connected to the clock inputs T of all three evaluation circuits 11, 12, 13. In this way, the charging and discharging signals are synchronous at all measurement connections.

During operation of this system, a measurement signal which depends on the impedance difference between the sensor elements A1, B1 of the first sensor 14 can be accessed between the poles D1 and D2 of the first evaluation circuit. This measurement signal thus indicates how far a measurement object has moved away from a central position (the center point of the circle on which the sensor elements lie) in the vertical direction. A measurement signal which depends on the impedance difference between the sensor elements A2, B2 of the second sensor 15 can be accessed between the poles D3 and D4 of the third evaluation circuit. This measurement signal thus indicates how far a measurement object has moved away from the central position in the horizontal direction. A measurement signal which depends on the impedance difference of all four sensor elements A1, A2, B1, B2 relative to the reference element 16 can be accessed between the poles D5, D6 of the second evaluation circuit. This measurement signal is a measure of the distance of the measured object in a direction perpendicular to the plane of the drawing. The measured object should be small relative to the sensor, i.e., the cross-sectional area of the measured object is smaller in the direction of the sensor than the diameter of the sensor. The measured object can be, for example, a ball or a cylindrical rod whose end face is directed toward the sensor.

It is easy to recognize that the system shown will work well even if only the first sensor, the first and second evaluation units, and the reference element are present. In this case, the position detection ability would be restricted to a horizontal or vertical direction in the plane of the drawing and a direction perpendicular to the plane of the drawing.

The exemplary embodiment of a system according to the present disclosure shown in FIG. 4 is similar to the exemplary embodiment in FIG. 3, wherein the sensor elements here are not formed by circular arcs but by segments of a circular surface. The mode of operation is otherwise largely identical.

With regard to other advantageous embodiments of the teaching according to the present disclosure, in order to avoid repetition, reference is made to the general part of the description and also to the accompanying claims.

Finally, it is expressly pointed out that the above-described exemplary embodiments serve only to explain the claimed teaching, but do not restrict it to the exemplary embodiments.

LIST OF REFERENCE NUMBERS

1 Evaluation circuit
2 Charging and discharging circuit
3 Clock circuit
4 First binarization circuit
5 Second binarization circuit
6 Comparator circuit
7 Integrator circuit
8 Voltage divider
9 Inverting circuit
10 Measurement output
11 First evaluation circuit
12 Second evaluation circuit
13 Third evaluation circuit
14 First sensor
15 Second sensor
16 Reference element The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An evaluation circuit for evaluating a capacitive or an inductive sensor, comprising:

a first measurement connection and a second measurement connection, wherein the first measurement connection is configured to connect a first sensor element of the capacitive or inductive sensor and the second measurement connection is configured to connect a second sensor element of the capacitive or inductive sensor or a reference element;

a charging and discharging circuit configured to output a first charging and discharging signal to the first measurement connection and to output a second charging and discharging signal to the second measurement connection;

a comparator circuit which compares a temporal behavior of the first charging and discharging signal with a temporal behavior of the second charging and discharging signal, and an integrator circuit connected to an output of the comparator circuit, wherein an output voltage of the integrator circuit changes as a function of a voltage at the output of the comparator circuit, wherein the output voltage of the integrator circuit is connected to the first measurement connection in order to adjust the first charging and discharging signal or to the second measurement connection in order to adjust the second charging and discharging signal, wherein a measurement signal at an output of the evaluation circuit is derived from the output voltage of the integrator circuit, and wherein the measurement signal is a measure of a difference between impedances of the first and the second sensor elements or impedances of the first sensor element and the reference element.

2. The evaluation circuit according to claim 1, comprising an inverting circuit, wherein the output voltage of the integrator circuit is input into an input of the inverting circuit, and wherein an output voltage of the inverting circuit relative to a reference voltage changes in the opposite direction as the output voltage of the integrator circuit.

3. The evaluation circuit according to claim 2, wherein the measurement signal is formed by a voltage between the output voltage of the integrator circuit and the output voltage of the inverting circuit.

4. The evaluation circuit according to claim 2, wherein the output voltage of the inverting circuit, in order to adjust the first charging and discharging signal, is connected to the first measurement connection when the output voltage of the integrator circuit is connected to the second measurement connection or, in order to adjust the second charging and discharging signal, is connected to the second measurement connection when the output voltage of the integrator circuit is connected to the first measurement connection.

5. The evaluation circuit according to claim 1, wherein the first measurement connection is connected to a first binarization circuit and the second measurement connection is connected to a second binarization circuit.

6. The evaluation circuit according to claim 1, the comparator circuit comprises a D flip-flop with a clock input and a data input.

7. The evaluation circuit according to claim 5, wherein the comparator circuit comprises a D flip-flop with a clock input and a data input, and wherein an output of the first binarization circuit is connected to the clock input of the D flip-flop, and an output of the second binarization circuit is connected to the data input of the D flip-flop.

8. The evaluation circuit according to claim 1, wherein the integrator circuit is implemented by an operational amplifier.

9. The evaluation circuit according to claim 8, wherein a non-inverting input of the operational amplifier is connected to a voltage which is more than zero volts, wherein the voltage which is more than zero volts is derived from a supply voltage of the evaluation circuit via a voltage divider.

10. The evaluation circuit according to claim 1, further comprising a clock input, wherein the clock input is connected to the charging and discharging circuit, and wherein the charging and discharging circuit is configured to derive the first and the second charging and discharging signals from a signal present at the clock input.

11. The evaluation circuit according to claim 10, further comprising a clock circuit, wherein an output of the clock circuit is connected to the clock input.

12. A system for evaluating a capacitive or an inductive sensor, comprising:
a first evaluation circuit according to claim 1;
a second evaluation circuit according to claim 1;
a first capacitive or inductive sensor having two sensor elements; and
a reference element,
wherein a first sensor element of the first capacitive or inductive sensor is connected to the first measurement connection of the first evaluation circuit and a second sensor element of the first capacitive or inductive sensor is connected to the second measurement connection of the first evaluation circuit,
wherein the reference element is connected to the second measurement connection of the second evaluation circuit, and
wherein the first measurement connection of the second evaluation circuit is connected to the first and second measurement connections of the first evaluation circuit via a coupling resistor in each case.

13. The system according to claim 12, further comprising a third evaluation circuit and a second capacitive or inductive sensor with two sensor elements, wherein the third evaluation circuit comprises:
a first measurement connection and a second measurement connection, wherein the first measurement connection is configured to connect a first sensor element of a capacitive or inductive sensor and the second measurement connection is configured to connect a second sensor element of the capacitive or inductive sensor or a reference element;
a charging and discharging circuit configured to output a first charging and discharging signal to the first measurement connection and to output a second charging and discharging signal to the second measurement connection;
a comparator circuit which compares a temporal behavior of the first charging and discharging signal with a temporal behavior of the second charging and discharging signal; and an integrator circuit connected to an output of the comparator circuit, wherein an output voltage of the integrator circuit changes as a function of a voltage at the output of the comparator circuit,
wherein the output voltage of the integrator circuit is connected to the first measurement connection in order to adjust the first charging and discharging signal or to the second measurement connection in order to adjust the second charging and discharging signal,
wherein a measurement signal at an output of the evaluation circuit is derived from the output voltage of the integrator circuit, and
wherein the measurement signal is a measure of a difference between impedances of the first and the second sensor elements or impedances of the first sensor element and the reference element;

wherein a first sensor element of the second capacitive or inductive sensor is connected to the first measurement connection of the third evaluation circuit and a second sensor element of the second capacitive or inductive sensor is connected to the second measurement connection of the third evaluation circuit, and wherein the first measurement connection of the second evaluation circuit is additionally connected to the first and the second measurement connections of the third evaluation circuit via a coupling resistor in each case.

14. The system according to claim 13, wherein the sensor elements of the first capacitive or inductive sensor and the sensor elements of the second capacitive or inductive sensor are each constructed symmetrically, wherein an axis of symmetry of the first capacitive or inductive sensor and an axis of symmetry of the second capacitive or inductive sensor are arranged perpendicular to one another.

15. The system according to claim 13, wherein the sensor elements of the first capacitive or inductive sensor and the sensor elements of the second capacitive or inductive sensor are formed by circular arcs or by circular segments.

16. The system according to claim 12, further comprising a clock circuit, wherein a clock signal generated by the clock circuit is input into a clock input of the respective first and second evaluation circuit.

17. The system according to claim 12, wherein one of the first, second, or third evaluation circuits contains a clock circuit and is configured to output a clock signal generated by the clock circuit via a clock output, and the clock output is connected to a clock input of the other two of the first, second, or third evaluation circuit that do not contain the clock circuit.

18. A method for evaluating a capacitive or inductive sensor using an evaluation circuit according to claim 1, comprising:
generating the first and second charging and discharging signal;
repeatedly charging and discharging a first sensor element of the capacitive or inductive sensor by way of the first charging and discharging signal;
repeatedly charging and discharging a second sensor element of the capacitive or inductive sensor of a reference element by way of the second charging and discharging signal;
comparing the temporal behavior of the first charging and discharging signal with the temporal behavior of the second charging and discharging signal;
changing the output voltage of the integrator circuit as a function of the result of the comparison of the temporal behavior;
adjusting the first charging and discharging signal and/or the second charging and discharging signal as a function of the output voltage of the integrator circuit, and
deriving and outputting a measurement signal from the output voltage of the integrator circuit as a measure of the difference between the impedances of the first and the second sensor elements or the impedances of the first sensor element and the reference element.

19. The evaluation circuit according to claim 5, wherein the first and second binarization circuits are each implemented by Schmitt trigger circuitry.

20. The evaluation circuit according to claim 10, wherein the charging and discharging circuit is formed by a resistor or an interconnection of a plurality of resistors.

* * * * *

UNITED STATES PATENT AND TRADEMARK OFFICE
CERTIFICATE OF CORRECTION

| | |
|---|---|
| PATENT NO. | : 11,112,439 B2 |
| APPLICATION NO. | : 16/603562 |
| DATED | : September 7, 2021 |
| INVENTOR(S) | : Peter Czardybon |

It is certified that error appears in the above-identified patent and that said Letters Patent is hereby corrected as shown below:

In the Claims

<u>Column 15, Claim 6, Lines 54-55:</u>
"to claim 1, the comparator circuit" should read: --to claim 1, wherein the comparator circuit--.

<u>Column 17, Claim 17, Line 27:</u>
"according to claim 12, wherein" should read: --according to claim 13, wherein--.

Signed and Sealed this
Twenty-fourth Day of January, 2023

Katherine Kelly Vidal
*Director of the United States Patent and Trademark Office*